United States Patent [19]

Singh et al.

[11] Patent Number: 6,071,824
[45] Date of Patent: Jun. 6, 2000

[54] METHOD AND SYSTEM FOR PATTERNING TO ENHANCE PERFORMANCE OF A METAL LAYER OF A SEMICONDUCTOR DEVICE

[75] Inventors: Bhanwar Singh, Morgan Hill; Subhash Gupta; Mutya Vicente, both of San Jose; Susan Hsuching Chen, Sunnyvale, all of Calif.

[73] Assignee: Advanced Micro Devices, Inc., Sunnyvale, Calif.

[21] Appl. No.: 08/937,634

[22] Filed: Sep. 25, 1997

[51] Int. Cl.[7] .................................................. H01L 21/00
[52] U.S. Cl. .......................... 438/717; 156/345; 438/720; 438/736; 438/742
[58] Field of Search .................................... 438/696, 717, 438/720, 725, 736, 737, 742, 754; 156/345 P

[56] References Cited

U.S. PATENT DOCUMENTS

| | | |
|---|---|---|
| 4,532,002 | 7/1985 | White . |
| 5,219,788 | 6/1993 | Abernathey et al. ................ 438/720 X |
| 5,667,922 | 9/1997 | Martiska et al. . |
| 5,688,717 | 11/1997 | Shen et al. ........................... 438/720 X |
| 5,821,169 | 10/1998 | Nguyen et al. . |
| 5,827,436 | 10/1998 | Kamide et al. ...................... 438/720 X |
| 5,854,126 | 12/1998 | Tobben et al. . |
| 5,858,869 | 1/1999 | Chen et al. . |
| 5,858,879 | 1/1999 | Chao et al. ............................. 438/725 |
| 5,866,448 | 2/1999 | Pradeep et al. . |
| 5,866,945 | 2/1999 | Chen et al. . |

*Primary Examiner*—William Powell
*Attorney, Agent, or Firm*—Sawyer & Associates

[57] ABSTRACT

A method and system for patterning a metal layer of a semiconductor device is disclosed. The method and system includes providing a material with an antireflective low dielectric constant hard mask layer (antireflective low k hard mask layer) on top of the metal layer, and providing a photoresist pattern on top of the anti-reflective low k hard mask layer. The method and system further includes etching of the anti-reflective low k hard mask layer and etching of the metal layer, wherein the photoresist is removed but the anti-reflective low k hard mask layer remains. In a preferred embodiment, the mask layer can also be applied at low temperatures (i.e., >300°) to ensure that the physical properties of the integrated circuit are not affected. Finally, the low k material does not have to be removed after processing. Accordingly, through the use of an anti-reflective low k hard mask layer, the metal patterning can be more effectively accomplished in a deep submicron process, particularly a process that is required for 0.18 microns or smaller technologies.

26 Claims, 3 Drawing Sheets

METHOD AND SYSTEM FOR PATTERNING TO ENHANCE PERFORMANCE OF A METAL LAYER OF A SEMICONDUCTOR DEVICE

FIELD OF THE INVENTION

The present invention relates generally to process technology for manufacturing semiconductor devices and more particularly to a method and system for the patterning of an integrated circuit device to enhance the performance thereof as well as to increase the number of semiconductor devices that can be produced per semiconductor wafer.

BACKGROUND OF THE INVENTION

It is desirable to shrink the feature size of semiconductor devices to improve device performance and to pack more devices on wafers utilized to produce the devices. As the feature size of semiconductor devices gets smaller, for example, below 0.18 micron technology, it is more difficult to pattern the metal layers of the device. The primary reason for this difficulty is that the depth of focus for patterning the metal layer is less because of the reduced feature size. One way to address this depth of focus limitation is to provide a thinner photoresist layer thereon. However, when the photoresist layer is reduced, the etching of the feature becomes more difficult due to the high erosion rate of the photoresist.

One way to address this erosion problem with thinner photoresist is to provide a hard mask layer on top of the metal layer. However, hard mask layers that are conventionally utilized are made from materials that have high dielectric constants. In addition, the hard mask layers are typically highly reflective. Accordingly, the hard mask layers will have to be removed due to the resultant high capacitance due to their high dielectric constant and because they are highly reflective which can interfere with the manufacturing process. Finally, another problem associated with typical hard mask layers is that they must be applied utilizing a high temperature (>400° C.) and in so doing the properties of the underlying layers can be significantly affected.

The removal of the high dielectric hard mask layer requires an additional step that makes the overall process prohibitively expensive. As has aforementioned, the metal layers, as well as the high capacitance hard mask layers, are highly reflective. This further affects the performance of the integrated circuit as the feature size becomes smaller, i.e., smaller wavelengths. The anti-reflective properties of the features becomes more important for increased performance and the like.

What is needed is a system and method which will overcome the above-identified problems. This system should be easy to implement and should not significantly add to the processing steps in an existing system. The system and method in accordance with the present invention should be one which is cost effective and should be effectively implemented in existing process technology. The present invention addresses such a need.

SUMMARY OF THE INVENTION

A method and system for patterning a metal layer of a semiconductor device is disclosed. The method and system includes providing a material with an antireflective low dielectric constant hard mask layer (antireflective low k hard mask layer) on top of the metal layer, and providing a photoresist pattern on top of the anti-reflective low k hard mask layer. The method and system further includes etching of the anti-reflective low k hard mask layer and etching of the metal layer, wherein the photoresist is removed but the anti-reflective low k hard mask layer remains. In a preferred embodiment, the mask layer can also be applied at low temperatures (i.e., below 350°) to ensure that the physical properties of the integrated circuit are not affected. Finally, the low k material does not have to be removed after processing. Accordingly, through the use of an anti-reflective low k hard mask layer, the metal patterning can be more effectively accomplished in a deep submicron process, particularly a process that is required for 0.18 microns or smaller technologies.

DESCRIPTION OF THE INVENTION

The present invention relates to patterning of a metal layer on an integrated circuit. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
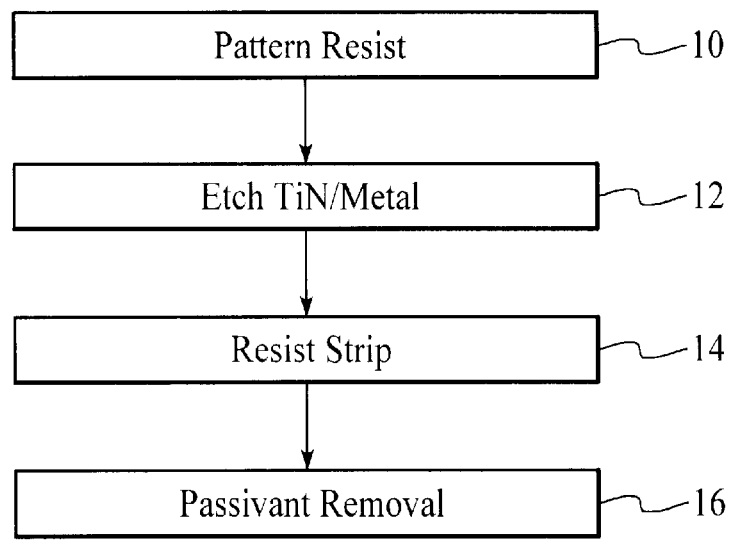
FIG. 1 is a flow chart of a prior art technique for patterning a metal layer in an integrated circuit.
Figure 2A:
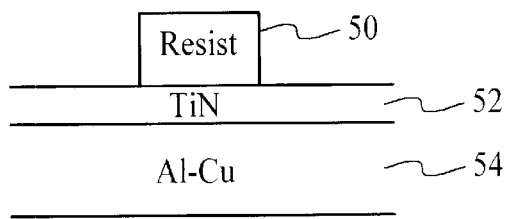
FIGS. 2A–2E are diagrams of an integrated circuit when being processed in accordance with FIG. 1.
Figure 2B:
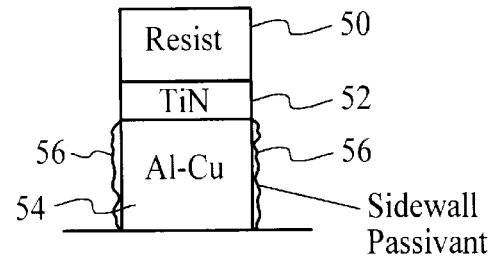
Figure 2C:
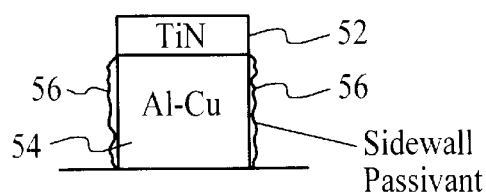
Figure 2D:
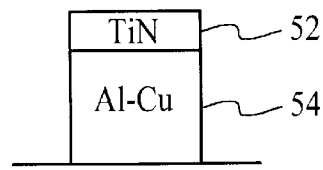
Figure 2E:
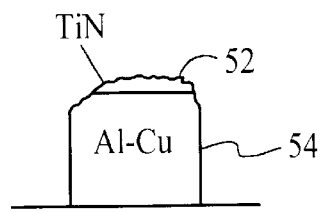

FIG. 1 is a flow chart of a conventional processor at the smaller processing technologies. FIGS. 2A–2D are diagrams of an integrated device during the various steps shown in FIG. 1. As is seen, referring now to FIG. 2A at first a photoresist 50 is placed on top of a barrier layer 52, such as TiN, and a metal layer 54 such as aluminum or an aluminum alloy, via step 10. Typically, the photoresist is 1.2–1.5 microns in thickness, the barrier is 1100 Å in thickness and the metal layer is between 5000–8000 Å in thickness. Thereafter, the barrier layer 52 and metal layer 54 are etched, via step 12. In this step, the metal layer 52 typically passivates shown generally at 56 around the sidewalls 58. This passivated layer 56, as will be discussed later, must be removed. Next, a resist strip takes place, via step 14. In this step the photoresist 50 is removed. Thereafter, the sidewall passivation is removed, via step 16. As has been above mentioned, at the smaller process technologies, oftentimes during the etching process, if the photoresist is too thick, the feature may not be accurate, due to the depth of focus limitations or if a thinner photoresist is utilized, some of the metal layer may be removed due to erosion of the photoresist as shown at FIG. 2E.

To explain the problem associated with the prior art process at smaller technologies in more detail, refer to the following. In typical process, the aspect ratio, that is the thickness of the photoresist (t) and the feature size (f) or t/f should be no greater than 3.5. At these smaller feature sizes, the photoresist thickness can be as great as 1.2 to 1.5 microns. At these thicknesses, there are depth of focus limitations. The alternative is to provide a thinner photoresist.

It is known that during the etching process there is typically a 1/1 selectivity ratio between etching the photoresist and the metal layer. However, at technologies at 0.18 microns or below, the metal layer may be approximately 0.3 microns wide and therefore, utilizing the above identified standard for the aspect ratio of 3.5 the photoresist thickness should be between 0.9–1.0 microns. At this thickness, the final device can become badly flawed because the etching process can erode the photoresist at such a rate that the underlying metal layer is affected (FIG. 2E). Accordingly, as has been before-mentioned, hard mask layers have been utilized to protect the metal layers but heretofore, such hard mask layers have been made from a high dielectric material that also typically have high reflectivity properties.

Consequently, as above-mentioned the hard mask material had to be removed after the etching process to maximize the performance of the device. In addition, typically the conventional hard mask layer materials must be applied to metal layer at a high temperature (above 400° C.) materials. Accordingly, its application to the metal layer may also affect the properties of the underlying layers of the device. Accordingly, a method and system in accordance with the present invention, overcomes the above-mentioned problems that occur during the etching process particularly at submicron processing technologies where features sizes are 0.3 micron or less.

The present invention utilizes a low dielectric (low k) antireflective hard mask layer to protect the metal layer during the etching process. The antireflective low k hard mask layer can remain on top of the metal layer after processing because the capacitance provided thereby is minimal and because it is antireflective. In a preferred embodiment, the antireflective low k hard mask layer material is also low temperature to ensure that the physical properties of the integrated circuit are minimally affected. Accordingly, through the use of an antireflective low k hard mask layer, the metal integration can be more effectively accomplished in a deep submicron process, particularly those processes that are 0.18 or smaller. To more clearly describe the features of the present invention, refer now to FIG. 3 and FIGS. 4A–4D.

Figure 3:
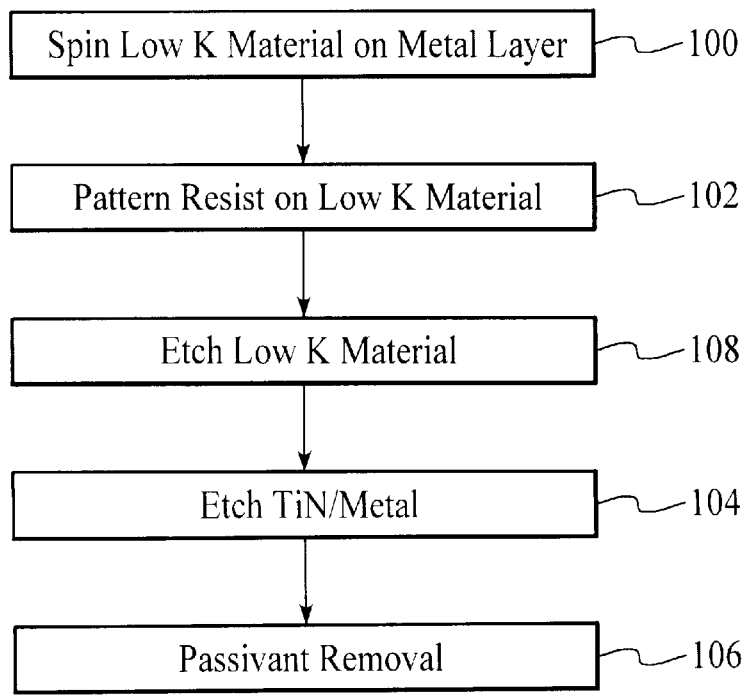
FIG. 3 is a flow chart of a process for patterning a metal layer in accordance with the present invention.
Figure 4A:
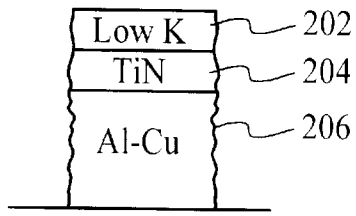
FIGS. 4A–4E are diagrams showing the patterning of an integrated circuit in accordance with the flowchart of FIG. 4.

FIG. 3 is a flow chart of a process for patterning a metal layer at a submicron process technology. FIGS. 4A–4E are diagrams showing the patterning of a metal layer in accordance with the flow chart of FIG. 3. Referring now to the figures, in a preferred embodiment, first the antireflective low dielectric (k) layer 202 is spun over the barrier metal 204 and metal layer 206, via step 100 (FIG. 4A). In a preferred embodiment, the antireflective low k hard mask layer 202 is baked onto the barrier metal 204 and the metal layer 206 utilizing a standard process. The antireflective low k hard mask layer is typically 1,000–2,000 Angstroms in thickness. The barrier material 204 is approximately the same thickness. The metal layer 206 is approximately 5,000–8,000 Angstroms in thickness. As has been mentioned, in a preferred embodiment, the antireflective low k hard mask layer 202 is a low temperature material.

A typical low temperature material which would have the described properties is HSQ hydrogensilsequioxane, manufactured by Dow Corning. The baking temperature of HSQ is approximately 250° C. The properties of the underlying layers in the device are not affected at this temperature and therefore the performance of the resultant device is unaffected by the baking process.

Figure 4B:
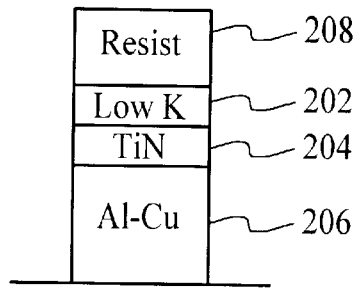
Figure 4C:
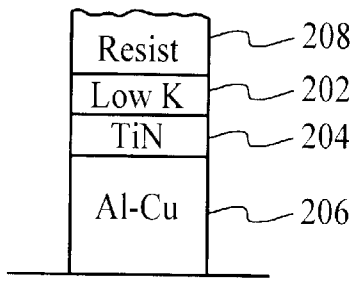
Figure 4D:
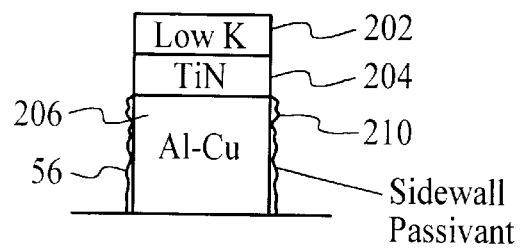
Figure 4E:
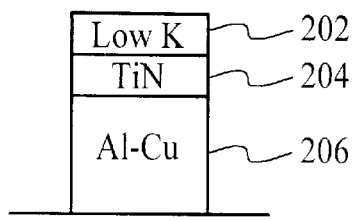

Next, photoresist 208 is patterned on the anti-reflective low k hard mask layer 202 using a conventional mask, via step 102, (FIG. 4B). This is followed by an etch process to etch the anti-reflective low k hard mask layer 202, with preferably a fluorocarbon chemistry, via step 308, (FIG. 4C). Thereafter the photoresist 208 and metal layer is etched utilizing chlorine chemistry in a preferred embodiment, via step 104, (FIG. 4D). The antireflective low k hard mask layer 202 acts as a hard mask that protects the metal layer during the etching process due to the selectivity between resist 208 and the anti-reflective low k hard mask layer material 202. Finally, the passivated metal is removed, via step 106, (FIG. 4E).

As has been before mentioned, the selectivity between resist and metal is 1:1. In a preferred embodiment the selectivity between the anti-reflective low k hard mask layer material and the resist is 8:1. Since the photoresist erosion is high, the anti-reflective low k hard mask layer material can very easily protect the metal layer and prevent erosion thereof. In addition, as has been above mentioned, one of the key features of the present invention is that the low k hard mask layer is antireflective. That is, by the application of the antireflective low k hard mask layer the subsequent photolithography is no longer affected by the high reflectivity of the metal layer. Therefore, the anti-reflective low k hard mask layer does not have to be removed.

As has been before mentioned, HSQ, which is manufactured by Dow Corning, is one example of such a material that could be utilized as the hard mask layer. Therefore, the anti-reflective low k hard mask layer material has two major advantages: (1) since it provides minimal capacitance it does not have to be removed, and (2) because it is antireflective it allows for the subsequent photolithography to be substantially unaffected.

Accordingly, a system and method in accordance with the present invention has the following advantages. By using an antireflective, low k hard mask layer, a hard mask layer on a metal layer can be provided that is easily applied using a spin process to the metal layer. In addition, since an antireflective low k hard mask layer is utilized that is processed at a low temperature, the underlying layers of the device are not affected by the process of applying the antireflective low k hard mask layer thereon. In addition, there is a better photolithography control due to the low reflectivity of the low k material. Accordingly, the anti-reflective low k hard mask layer allows for the use of thinner photoresist that will improve the depth of focus in manufacturing integrated circuit devices.

Finally, through this process since the photoresist can be thinner, the photoresist is removed through the etching process, rather than having to provide a subsequent resist strip operation which can degrade the part. Finally, the antireflective low k hard mask layer can remain over the metal layer since as a dielectric material it does not affect the performance of the device. Hence, there is no need to strip that layer away.

Accordingly, what has been shown is that a system and method are provided which anti-reflective low k hard mask layer materials can be used to help pattern metal layers of semiconductor devices at the smallest process technology. In so doing, a device is provided which can be more reliably etched than previously known devices at the smaller technologies such as required for a process that is 0.18 micron and smaller technologies.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for patterning a metal layer of a semiconductor device comprising the steps of:
   (a) providing an antireflective low dielectric constant hard mask layer (antireflective low k hard mask layer) on top of the metal layer;
   (b) providing a photoresist pattern on top of the antireflective low k hard mask layer, the antireflective low k hard mask layer being disposed between the metal layer and the photoresist pattern;
   (c) etching the antireflective low k hard mask layer; and
   (d) etching the metal layer, wherein the photoresist pattern is removed but the antireflective low k hard mask layer remains.

2. The method of claim 1 wherein the providing step (a) comprises the step of:
   (a1) spinning the antireflective low k hard mask layer on the metal layer.

3. The method of claim 1 wherein step (d) comprises the step of etching the metal layer utilizing a chlorine chemistry.

4. The method of claim 2 wherein the antireflective low k hard mask layer is provided in a low temperature operation.

5. The method of claim 4 wherein the semiconductor device includes a feature of 0.25 microns or less.

6. The method of claim 5 wherein the low temperature operation is performed below 350° C.

7. The method of claim 1 which includes providing a barrier metal on top of the metal layer.

8. The method of claim 7 wherein the barrier metal comprises TiN.

9. The method of claim 8 wherein the metal layer comprises an aluminum/copper alloy.

10. The method of claim 7 wherein the antireflective low k hard mask layer comprises hydrogensilsequioxane.

11. A system for patterning a metal layer of a semiconductor device comprising:
   means for providing an antireflective low dielectric constant hard mask layer (antireflective low k hard mask layer) on top of the metal layer;
   means for providing a photoresist pattern on top of the antireflective low k hard mask layer, the antireflective low k hard mask layer being disposed between the metal layer and the photoresist pattern;
   means for etching the antireflective low k hard mask layer; and
   means for etching the metal layer, wherein the photoresist pattern is removed but the antireflective low k hard mask layer remains.

12. The system of claim 11 wherein the providing step (a) comprises the step of:
   means for spinning the antireflective low k hard mask layer on the metal layer.

13. The system of claim 11 wherein step (d) comprises the step of etching the metal layer utilizing a chlorine chemistry.

14. The system of claim 12 wherein the antireflective low k hard mask layer is provided in a low temperature operation.

15. The system of claim 14 wherein the semiconductor device includes a feature of 0.25 microns or less.

16. The system of claim 15 wherein the low temperature operation is performed below 350° C.

17. The system of claim 11 which includes means for providing a barrier metal on top of the metal layer.

18. The system of claim 17 wherein the barrier metal comprises TiN.

19. The system of claim 18 wherein the metal layer comprises an aluminum/copper alloy.

20. The system of claim 17 wherein the antireflective low k hard mask layer comprises hydrogensilsequioxane.

21. The method of claim 1 wherein the antireflective low k hard mask layer further includes a top surface having a first planarity and a bottom surface having a second planarity, and wherein the first planarity is capable of being substantially the same as the second planarity.

22. The method of claim 1 wherein the antireflective low k hard mask layer has a first etch selectivity, the photoresist pattern has a second etch selectivity, the first etch selectivity being greater than the second etch selectivity, allowing the photoresist pattern to be removed during the metal layer etching step (d).

23. The method of claim 1 wherein the antireflective low k hard mask layer providing step (a) further includes the step of:
   (a1) spinning the antireflective low k hard mask layer onto the metal layer.

24. The system of claim 11 wherein the antireflective low k hard mask layer further includes a top surface having a first planarity and a bottom surface having a second planarity, and wherein the first planarity is capable of being substantially the same as the second planarity.

25. The system of claim 11 wherein the antireflective low k hard mask layer has a first etch selectivity, the photoresist pattern has a second etch selectivity, the first etch selectivity being greater than the second etch selectivity, allowing the photoresist pattern to be removed by the metal layer etching means.

26. The system of claim 11 wherein the antireflective low k hard mask layer providing means further includes:
   means for spinning the antireflective low k hard mask layer onto the metal layer.

* * * * *